US012604710B2

(12) United States Patent
Grzeskowiak et al.

(10) Patent No.: US 12,604,710 B2
(45) Date of Patent: Apr. 14, 2026

(54) METHOD AND APPARATUS FOR IN-SITU DRY DEVELOPMENT

(71) Applicant: Tokyo Electron Limited, Tokyo (JP)

(72) Inventors: Steven Grzeskowiak, Albany, NY (US); Eric Chih-Fang Liu, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 534 days.

(21) Appl. No.: 17/950,001

(22) Filed: Sep. 21, 2022

(65) Prior Publication Data

US 2024/0096622 A1　Mar. 21, 2024

(51) Int. Cl.
H01L 21/027 (2006.01)
G03F 7/00 (2006.01)
H01J 37/32 (2006.01)

(52) U.S. Cl.
CPC ........ H01L 21/027 (2013.01); G03F 7/70033 (2013.01); G03F 7/70733 (2013.01); H01J 37/32743 (2013.01); H01J 37/32899 (2013.01); H01J 2237/334 (2013.01)

(58) Field of Classification Search
CPC .............. H01L 21/027; H01L 21/0274; H01L 21/67167; H01L 21/67196; H01L 21/67201; H01L 21/67207; H01L 21/67745; H01L 21/67161; H01L 21/67225; G03F 7/70033; G03F 7/70733; G03F 7/70991; G03F 7/2024; G03F 7/36; G03F 7/40; G03F 7/7075; H01J 37/32743; H01J 37/32899; H01J 2237/334
See application file for complete search history.

(56) References Cited

U.S. PATENT DOCUMENTS

| | | | | |
|---|---|---|---|---|
| 6,051,344 A | * | 4/2000 | Langston | ............ G03F 7/70483 430/5 |
| 6,762,133 B1 | * | 7/2004 | Rangarajan | ......... H01L 21/0274 134/1.1 |
| 7,608,367 B1 | * | 10/2009 | Aigeldinger | .............. G03F 1/22 430/5 |
| 10,784,175 B2 | | 9/2020 | Clark | |
| 2006/0046483 A1 | * | 3/2006 | Abatchev | ............ H01L 21/0331 438/689 |
| 2017/0287790 A1 | | 10/2017 | Rastogi et al. | |

(Continued)

FOREIGN PATENT DOCUMENTS

| | | | | | |
|---|---|---|---|---|---|
| KR | 102540963 B1 | * | 6/2023 | ......... | H01L 21/0274 |
| TW | 202129421 A | * | 8/2021 | ......... | G03F 7/70033 |

(Continued)

OTHER PUBLICATIONS

International Search Report and Written Opinion, PCT Application No. PCT/US2023/032621, mailed Jan. 5, 2024, 10 pages.

*Primary Examiner* — Mohammed Shamsuzzaman
(74) *Attorney, Agent, or Firm* — Slater Matsil, LLP

(57) ABSTRACT

An embodiment etching tool includes an etch chamber for plasma etching a first wafer to be processed; a transfer chamber coupled to the etch chamber; a first run path between the transfer chamber and the etch chamber, the first run path including a path for moving the first wafer to be processed from the transfer chamber to the etch chamber, where the etching tool is configured to dry develop the first wafer to be processed before etching a hard mask on the first wafer in the etch chamber.

15 Claims, 9 Drawing Sheets

(56)  References Cited

U.S. PATENT DOCUMENTS

2018/0337046  A1 *  11/2018  Shamma ........... H01L 21/67703
2019/0056914  A1 *   2/2019  Ma ........................... G03F 7/38
2019/0348292  A1 *  11/2019  Dutta ............... H01L 21/31144
2022/0035247  A1 *   2/2022  Tan ................... H01L 21/02274
2022/0244645  A1 *   8/2022  Tan ....................... G03F 7/0043

FOREIGN PATENT DOCUMENTS

WO        WO-2008070188  A1 *   6/2008   ........... G03F 7/0035
WO        WO-2009080610  A1 *   7/2009   ............. C23C 16/26
WO               2020264158  A1    12/2020
WO        WO-2022077136  A1 *   4/2022   ........... H10D 84/834
WO        WO-2022103764  A1 *   5/2022   ............. G03F 7/168
WO        WO-2023115023  A1 *   6/2023   ......... H01L 21/0274

* cited by examiner

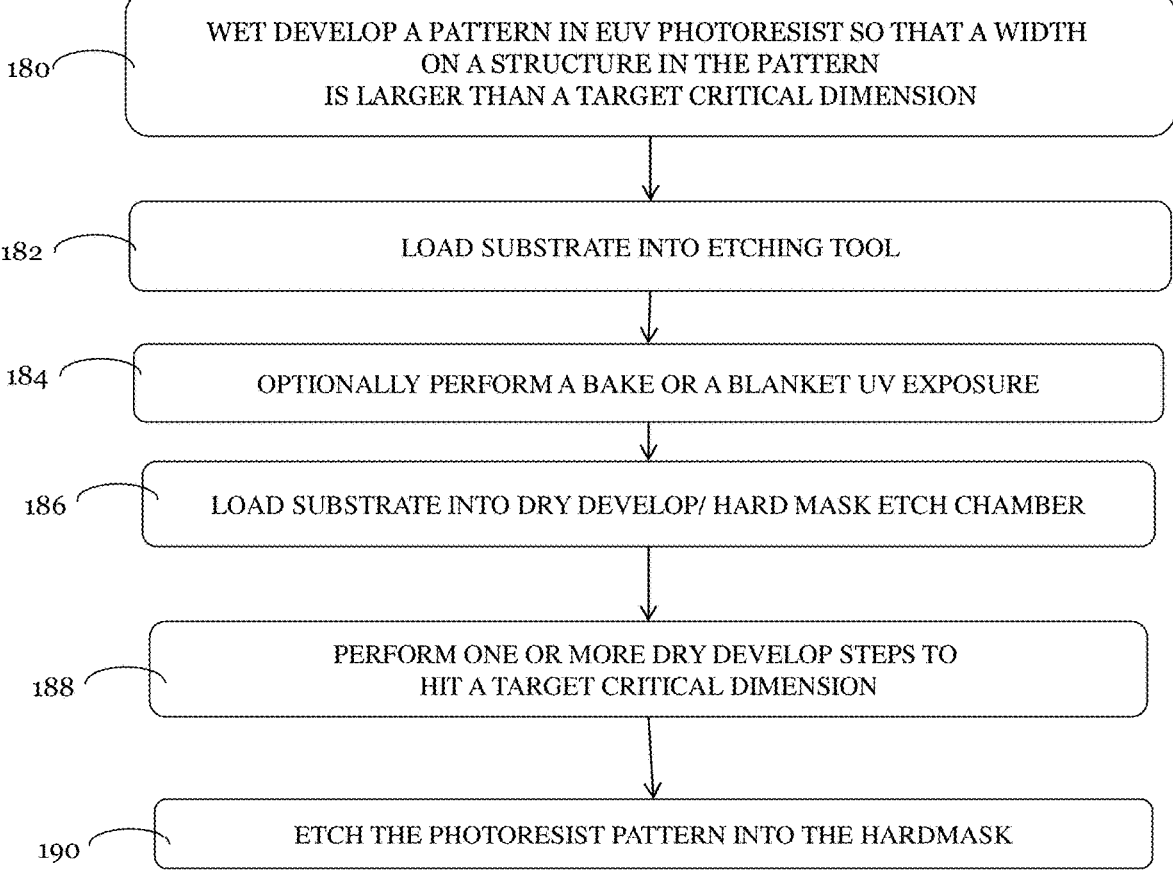

180 — WET DEVELOP A PATTERN IN EUV PHOTORESIST SO THAT A WIDTH ON A STRUCTURE IN THE PATTERN IS LARGER THAN A TARGET CRITICAL DIMENSION

182 — LOAD SUBSTRATE INTO ETCHING TOOL

184 — OPTIONALLY PERFORM A BAKE OR A BLANKET UV EXPOSURE

186 — LOAD SUBSTRATE INTO DRY DEVELOP/ HARD MASK ETCH CHAMBER

188 — PERFORM ONE OR MORE DRY DEVELOP STEPS TO HIT A TARGET CRITICAL DIMENSION

190 — ETCH THE PHOTORESIST PATTERN INTO THE HARDMASK

FIG. 12

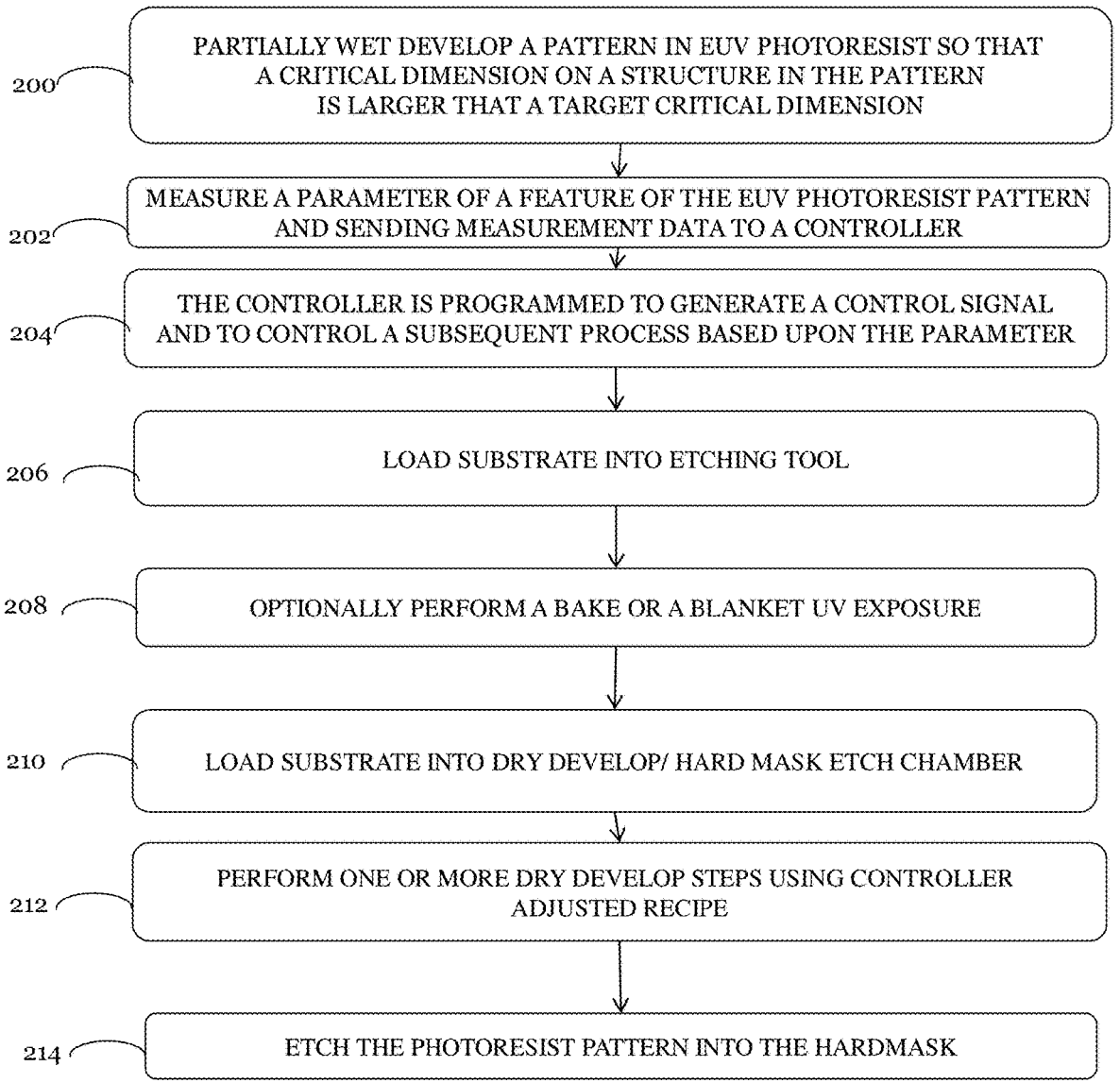

200    PARTIALLY WET DEVELOP A PATTERN IN EUV PHOTORESIST SO THAT A CRITICAL DIMENSION ON A STRUCTURE IN THE PATTERN IS LARGER THAT A TARGET CRITICAL DIMENSION

202    MEASURE A PARAMETER OF A FEATURE OF THE EUV PHOTORESIST PATTERN AND SENDING MEASUREMENT DATA TO A CONTROLLER

204    THE CONTROLLER IS PROGRAMMED TO GENERATE A CONTROL SIGNAL AND TO CONTROL A SUBSEQUENT PROCESS BASED UPON THE PARAMETER

206    LOAD SUBSTRATE INTO ETCHING TOOL

208    OPTIONALLY PERFORM A BAKE OR A BLANKET UV EXPOSURE

210    LOAD SUBSTRATE INTO DRY DEVELOP/ HARD MASK ETCH CHAMBER

212    PERFORM ONE OR MORE DRY DEVELOP STEPS USING CONTROLLER ADJUSTED RECIPE

214    ETCH THE PHOTORESIST PATTERN INTO THE HARDMASK

FIG. 14

METHOD AND APPARATUS FOR IN-SITU DRY DEVELOPMENT

CROSS-REFERENCE TO RELATED APPLICATIONS

This application is related to U.S. application Ser. No. 17/943,729, filed on Sep. 13, 2022, which application is hereby incorporated herein by reference.

TECHNICAL FIELD

The present invention relates generally to lithography, and, in particular embodiments, to methods and apparatus for in-situ dry development.

BACKGROUND

Semiconductor manufacturing includes several processing steps that involve forming patterns on the semiconductor substrates. These processing steps include, among others, coating the surface of the substrate with photo resist, developing a latent pattern, and transferring the pattern into the surface of the substrate by etching.

In routine microfabrication processes, a layer of photoresist is coated on a working surface (upper surface) of a substrate such as a semiconductor wafer. The photoresist is subsequently patterned via photolithography to define a mask pattern for transferring to an underlayer by etching using the patterned resist as an etch mask. Patterning of the photo resist generally involves steps of coating, exposure, and development. A working surface of the substrate is coated with a film of photo resist. The photo resist is exposed through a lithographic mask (and associated optics) using, for example, extreme ultraviolet (EUV) lithography. Patterned exposure is followed by a development process during which the removal of soluble regions of the photo resist occurs using either a wet (solvent) or a dry (gaseous) development process. Soluble regions can be exposed or non-exposed regions depending on the tone of the photoresist and developer used.

Extreme ultraviolet (EUV) lithography is a photolithography technology that uses photons within the extreme ultraviolet radiation range (124 nm-10 nm). Typically, a wavelength of 13.5 nm is used. EUV photo resists are usually metal-containing resists.

SUMMARY

In an embodiment, an etching tool includes an etch chamber for plasma etching a first wafer to be processed; a transfer chamber coupled to the etch chamber; a first run path between the transfer chamber and the etch chamber, the first run path including a path for moving the first wafer to be processed from the transfer chamber to the etch chamber, where the etching tool is configured to dry develop the first wafer to be processed before etching a hard mask on the first wafer in the etch chamber.

In an embodiment, a method for forming a patterned structure includes depositing a photoresist film over a hard mask material disposed over a semiconductor substrate; exposing the photoresist film with a pattern of extreme ultraviolet radiation to form an exposed photoresist film; loading the substrate into an apparatus capable of dry developing and capable of hard mask etching; dry developing the exposed photoresist film; and after the dry developing, etching the hard mask material in a hard mask etch chamber to form the patterned structure.

In an embodiment, a method for forming a patterned structure includes depositing a photoresist film over hard mask material disposed over a semiconductor substrate; exposing the photoresist film with a pattern of extreme ultraviolet radiation to form an exposed photoresist film; wet developing the exposed photoresist film on a wet development track; loading the substrate into a processing apparatus configured for dry developing and configured for plasma etching a hard mask; dry developing the exposed photoresist film to form a photoresist pattern; and etching the photoresist pattern into the hard mask material in a hard mask etch chamber to form the patterned structure.

BRIEF DESCRIPTION OF THE DRAWINGS

For a more complete understanding of the present invention, and the advantages thereof, reference is now made to the following descriptions taken in conjunction with the accompanying drawings, in which:

FIG. 12 is a flow diagram describing the formation of an EUV photoresist pattern using hybrid wet/dry develop plus in-situ hard mask etch in accordance with embodiments;

FIG. 14 is a flow diagram describing the formation of an EUV photoresist pattern using hybrid wet/dry develop plus in-situ hard mask etch using a controller in accordance with embodiments.

DETAILED DESCRIPTION OF ILLUSTRATIVE EMBODIMENTS

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

EUV radiation and EUV photoresists behave differently than conventionally used deep ultraviolet (DUV) radiation and DUV photo resists. Different techniques are therefore used with EUV lithography. EUV lithography enables higher patterning resolution capability. Thus, feature sizes are getting smaller and smaller leading to higher aspect ratios. To mitigate this trend, thinner photoresists were used. But going too thin photoresists creates etch transfer issues. Typically, the EUV photo resist pattern is first etched into hard mask material to form a hard mask. The hard mask is then used to etch the pattern into the underlying substrate. However, thin EUV photoresist patterns cannot hold up to the extended plasma etching processes needed for the EUV photoresist pattern to be transferred by etching into an underlying substrate.

Additionally, conventional EUV resists (non-metal-based EUV resists) have relatively low EUV absorption, which leads to stochastic issues. Moving to metal-based resists increases etch resistance when transferring into hard mask and increased EUV absorption (needed for the thinner thicknesses).

EUV resists can be wet developed using solvents or can be dry developed using gases. Conventional EUV photoresist development processes use a single wet development (or a single dry development) process to resolve a latent image exposed in the EUV photoresist.

Wet development processes inherently suffer from capillary forces caused by the surface tension of liquids. These capillary forces can lead to pattern distortion, pattern collapse, and other defects especially in high aspect ratio areas with critical dimensions less than 30 nm.

Dry development processes do not suffer from such capillary forces so dry development processes are typically used for EUV photoresist patterns with structures having a width of 30 nm or below.

Embodiments disclosed include tools and methods to dry develop EUV photoresist patterns and to in-situ etch EUV photoresist patterns into hard mask material to form a hard mask.

Etching tools configured to perform in-situ dry etching and hard mask etching of EUV photoresist patterns on semiconductor substrates according to embodiments will be described using FIGS. 1, 3, 8 and 13. Process flows for dry developing and hard mask etching EUV photoresist patterns in-situ are blocks listed in FIGS. 11, 12, and 14.

Figures 1, 2:
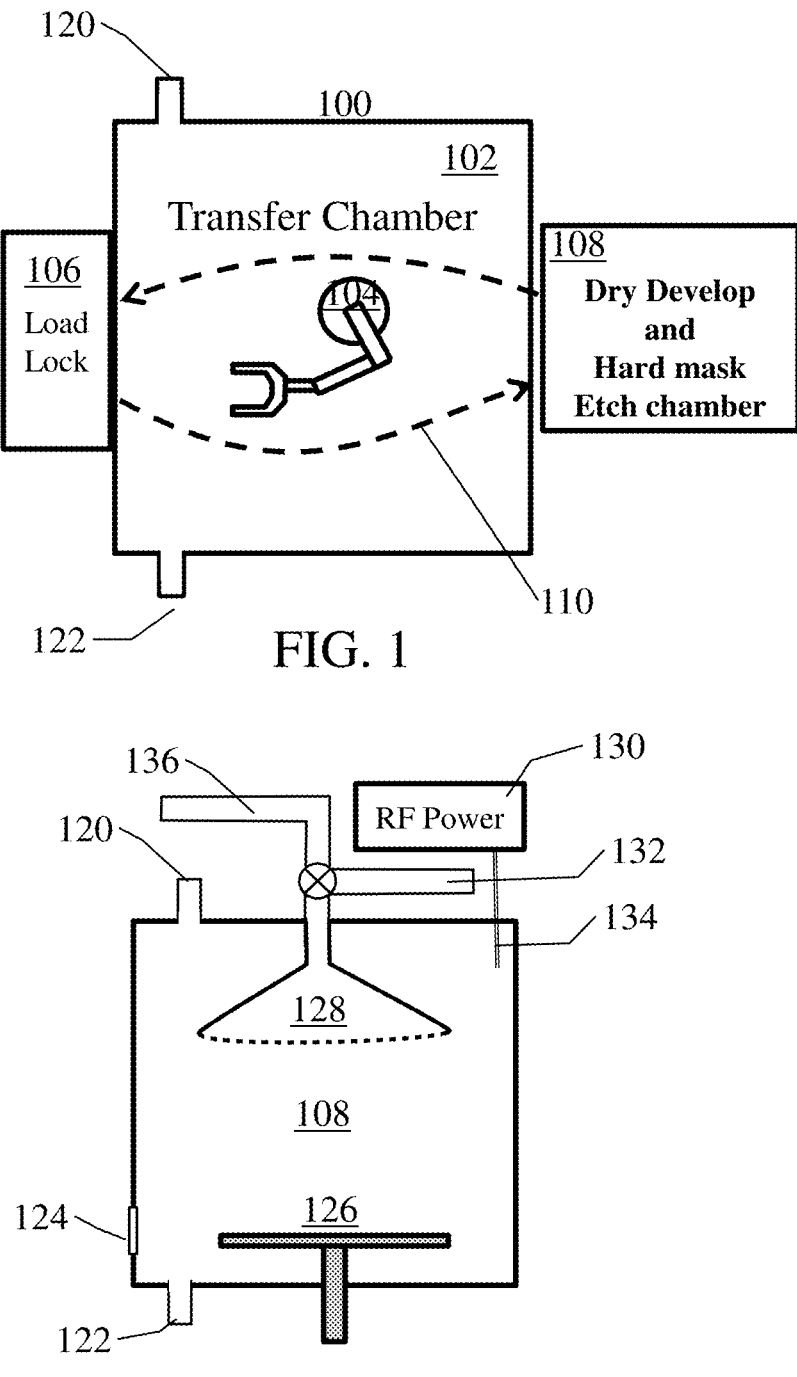
FIG. 1 is a block diagram of a semiconductor apparatus for developing and etching an EUV photoresist pattern in-situ in accordance with embodiments.
FIG. 2 is a block diagram of a combination dry develop plus hard mask etch chamber in accordance with embodiments.

FIG. 1 is a block diagram of an etching tool 100 for in-situ dry developing an EUV photoresist pattern and then etching the EUV photoresist pattern into hard mask material in accordance with embodiments.

The etching tool 100 in FIG. 1 includes a combination dry develop/hard mask etch chamber 108. The etching tool 100 comprises a load lock chamber 106 and the dry develop/hard mask etch chamber 108 attached to a transfer chamber 102. The dry develop/hard mask etch chamber 108 is not fluidly coupled to (i.e., sealed off from) the transfer chamber 102 after the wafer is transferred to the dry develop/hard mask etch chamber 108 for processing.

The load lock chamber 106 enables substrates such as wafers to be transferred from another apparatus outside the etching tool 100 to inside the transfer chamber 102. A wafer transport arm 104 in the transfer chamber 102 can transport wafers along a first run path 110 from the load lock chamber 106, through the transfer chamber 102, into the develop/hard mask etch chamber 108, and then back through the transfer chamber 102 to the load lock chamber when processing is complete. The first run path 110 is indicated by the dashed line in FIG. 1.

Gas inlet 120 delivers gases such as air or nitrogen into the transfer chamber 102. A vacuum port 122 in the transfer chamber 102, coupled to a vacuum pump (not shown), can evacuate gases from the transfer chamber prior to loading or unloading substrates from the load lock chamber 106 or from dry develop/hard mask etch chamber 108.

FIG. 2 illustrates an integrated dry develop/hard mask etch chamber in accordance with embodiments.

The dry develop/hard mask etch chamber 108 has gas inlet 120 for filling the chamber with a bulk gas such as helium, argon, or nitrogen when wafers are going to be transported into and out of the chamber. A vacuum port 122 connected to a vacuum pump (not shown) evacuates the chamber prior to dry developing and hard mask etching. The vacuum pump also removes process gases during processing. A wafer in/wafer out port 124 allows the wafer transport arm 104 to set wafers onto the wafer chuck 126 and to remove wafers from the wafer chuck 126 post processing. Hard mask etching gases may be delivered to the chamber via gas line 136. Dry developing gases may be delivered to the chamber via a separate develop gas line 132. The process gases may be directed into a shower head 128 above the wafer chuck 126. Since, at any instant, the dry develop/hard mask etch chamber 108 is being used for either etching or developing, in one or more embodiments, the etch gas line 136 and the develop gas line 132 may be combined within or outside the shower head 128.

The shower head 128 may be designed to disperse the gases uniformly across the wafer. A radio frequency (RF) power supply 130 connected to an antenna 134 inside the chamber provides RF power to initiate and sustain the plasma during the plasma develop process and during the hard mask etch process. A DC voltage may be applied to bias the wafer chuck 126 to add sputtering during plasma developing and hard mask etching.

Figure 3:
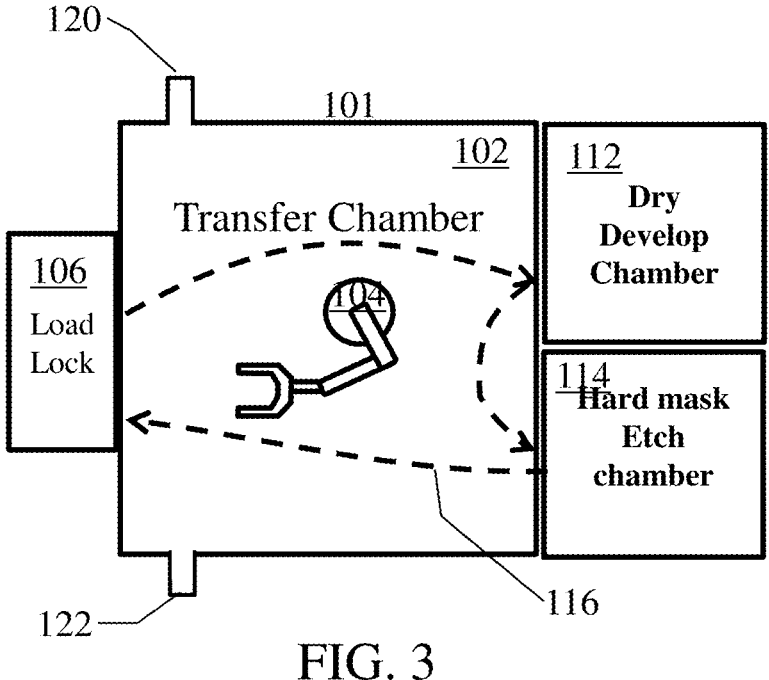
FIG. 3 is a block diagram of a semiconductor apparatus for developing and etching an EUV photoresist pattern in-situ in accordance with embodiments.

FIG. 3 describes an embodiment etching tool 101 for dry developing an EUV photoresist pattern and then etching it into hard mask material in-situ. The etching tool 101 comprises dry develop chamber 112 and a hard mask etch 114 chamber separately attached to the transfer chamber 102.

In this embodiment, the wafer transport arm 104 transports the wafer along a second run path 116 during processing. The wafer transport arm 104 first moves the wafer from the load lock chamber 106, through the transfer chamber 102, and into the dry develop chamber 112. After dry develop process is completed for the wafer, the wafer transport arm 104 moves the wafer along the second run path 116 from the dry develop chamber to the hard mask etch chamber 114. When hard mask etching is complete, the wafer transport arm moves the wafer from the hard mask etch chamber 114, through the transfer chamber 102, and back to the load lock chamber 106. The second run path 116 is indicated by the dashed line in FIG. 3.

The dry develop chamber 112 and the hard mask etch chamber 114 are not fluidly coupled to (i.e., sealed off from) the transfer chamber 102 after the wafer is transferred to either chamber for processing.

Figure 4:
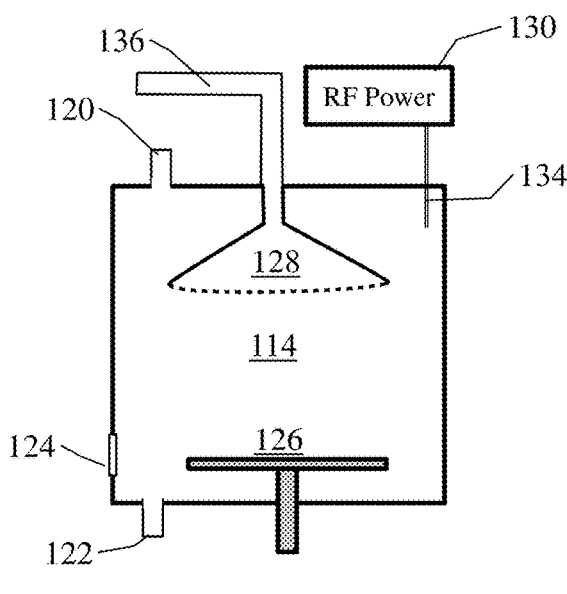
FIG. 4 is a block diagram of a hard mask etch chamber in accordance with embodiments.

A hard mask etch chamber 114 configured for hard mask etching is described in more detail in FIG. 4. This chamber may be similar to the dry develop/hard mask etch chamber 108 in FIG. 3, the difference being that with the dry developing gas line 132 may be removed.

Figure 5:
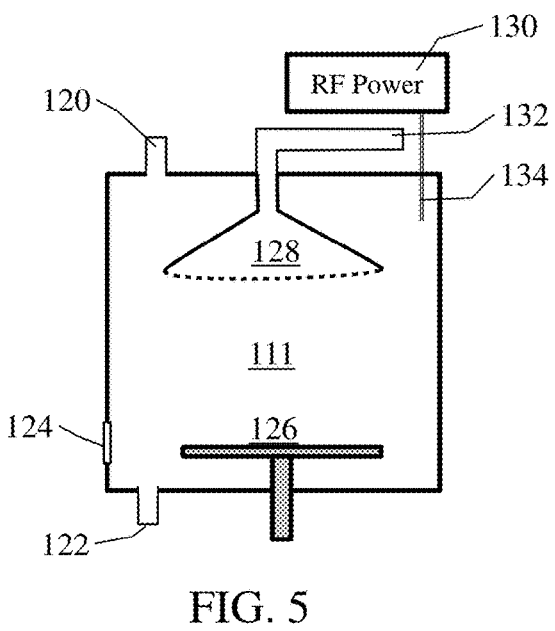
FIG. 5 is a block diagram of a plasma develop chamber in accordance with embodiments.
Figure 6:
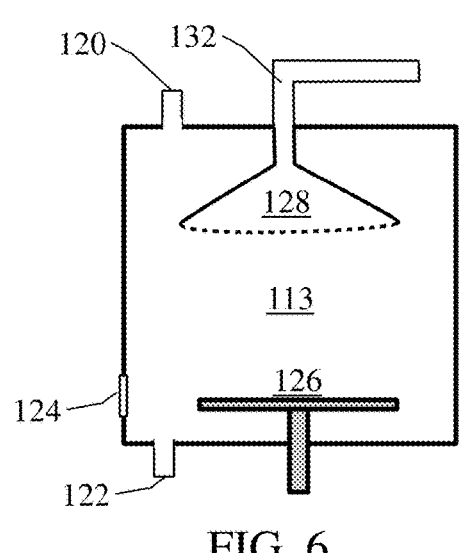
FIG. 6 is a block diagram of a chemical vapor develop chamber in accordance with embodiments.

In various embodiments, the dry develop chamber 112 may be configured for plasma develop chamber 111 (FIG. 5) or for chemical vapor develop chamber 113 (FIG. 6).

The plasma dry develop chamber 111 (FIG. 5) may be similar to the hard mask etch chamber 114, the difference being that it is plumbed for dry develop gas line 132 instead of hard mask etch gases.

The chemical vapor develop chamber 113 (FIG. 6) may be similar to the plasma develop chamber 111 but without the RF power 130 and without bias to the wafer chuck 126. For this and other reasons, chemical vapor develop chamber 113 may be significantly less expensive than plasma develop chamber 111.

Etching tool 101 in FIG. 3 may be less expensive when the dry develop chamber 112 is a chemical vapor develop chamber 113 instead of a plasma develop chamber 111.

Figure 7:
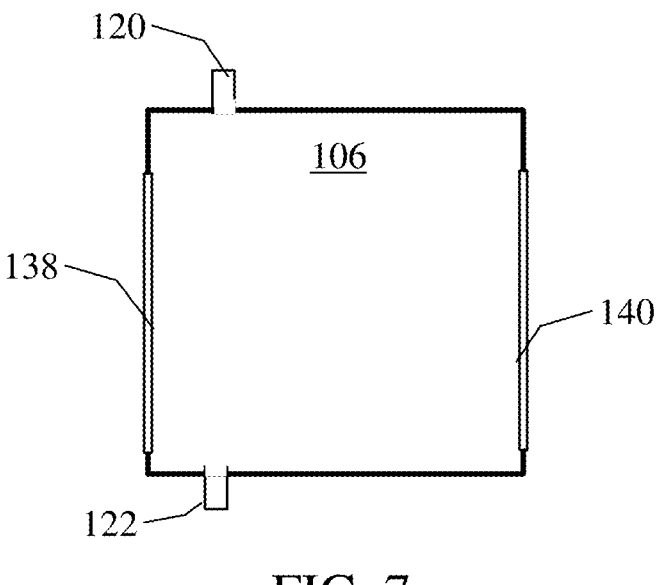
FIG. 7 is a block diagram of a load lock chamber in accordance with embodiments.

FIG. 7 illustrates a load lock chamber in accordance with embodiments.

A typical load lock chamber 106 used to transfer boat loads of substrates such as wafers from outside to inside a manufacturing tools such as etching tools 100 (FIG. 1) and 101 (FIG. 3) is illustrated in the block diagram in FIG. 7.

The load lock chamber 106 has a gas inlet 120 for filling the load lock chamber 106 with a bulk gas such as air or nitrogen. A vacuum port 122, connected to a vacuum pump (not shown), can evacuate the chamber prior to wafers being transferred from the load lock chamber 106 to processing chambers in the etching tool 100. A large input port door 138 enables a boat load of wafers to enter the load lock chamber 106 and a large output port door 140 allows the wafer transport arm 104 to remove wafers from the boat and to transfer them into process chambers in the etching tools 100 and 101.

In certain embodiments, the load lock chamber may be configured as a load lock/plasma develop chamber or as a load lock/chemical vapor develop chamber.

Figures 8, 9, 10:
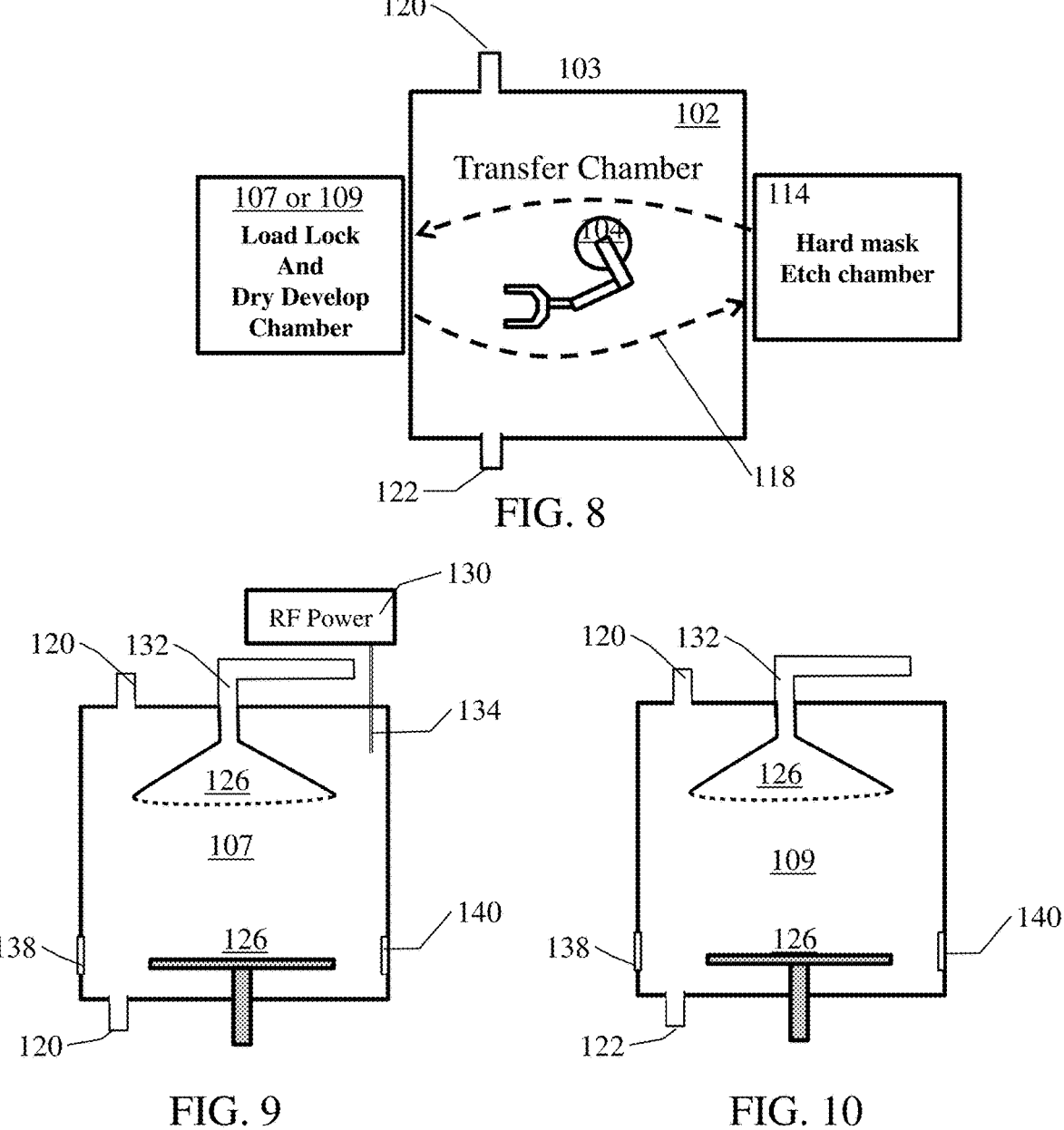
FIG. 8 is a block diagram of a semiconductor apparatus for developing and etching an EUV photoresist pattern in-situ in accordance with embodiments.
FIG. 9 is a block diagram of a combination load lock/plasma develop chamber in accordance with embodiments.
FIG. 10 is a block diagram of a combination load lock/chemical vapor develop chamber in accordance with embodiments.

FIG. 8 illustrates an etching tool in accordance with embodiments.

In the etching tool 103 illustrated in FIG. 8, the load lock chamber is configured to perform a dry develop process on the substrate or wafer before it is transferred through the transfer chamber 102 and into the hard mask etch chamber 114. The load lock/dry etch chamber 106 may be either a load lock/plasma develop chamber 107 (FIG. 9) or a load lock/chemical vapor develop chamber 109 (FIG. 10). The etching tool 103 in this embodiment with two processing chambers is less expensive than the etching tool 101 in FIG. 3 with three processing chambers. The third run path 118 in etching tool 103 is similar to the first run path 110 in etching tool 100 in FIG. 1.

The load lock/plasma develop chamber 107 (FIG. 9) may be similar to the plasma develop chamber 111 in FIG. 5 except that the load lock/plasma develop chamber 107 has both an input port door 138 for transporting wafers one-at-a-time into the load lock/plasma develop chamber 107 and an output port door 140 for transporting wafers out of the load lock/plasma develop chamber 107 and into the transfer chamber 102. In contrast, the plasma develop chamber 111 in FIG. 5 has a single wafer in/wafer out port 124.

Similarly load lock/chemical vapor develop chamber 109 (FIG. 10) may be similar to chemical vapor develop chamber 113 in FIG. 6, the difference being the load lock/chemical vapor develop chamber 109 has both input 138 and output 140 port doors, whereas the chemical vapor develop chamber 113 in FIG. 6 has a single wafer in/wafer out port 124.

Dry developing of EUV resist patterns can leave scumming or residues post development. This is especially a problem for EUV photoresist patterns with geometries 30 nm or less wide. A hybrid wet/development process described in co pending U.S. application Ser. No. 17/943, 729, mitigates residues and scumming. The co pending application is hereby included in its entirety for reference.

Figure 11:
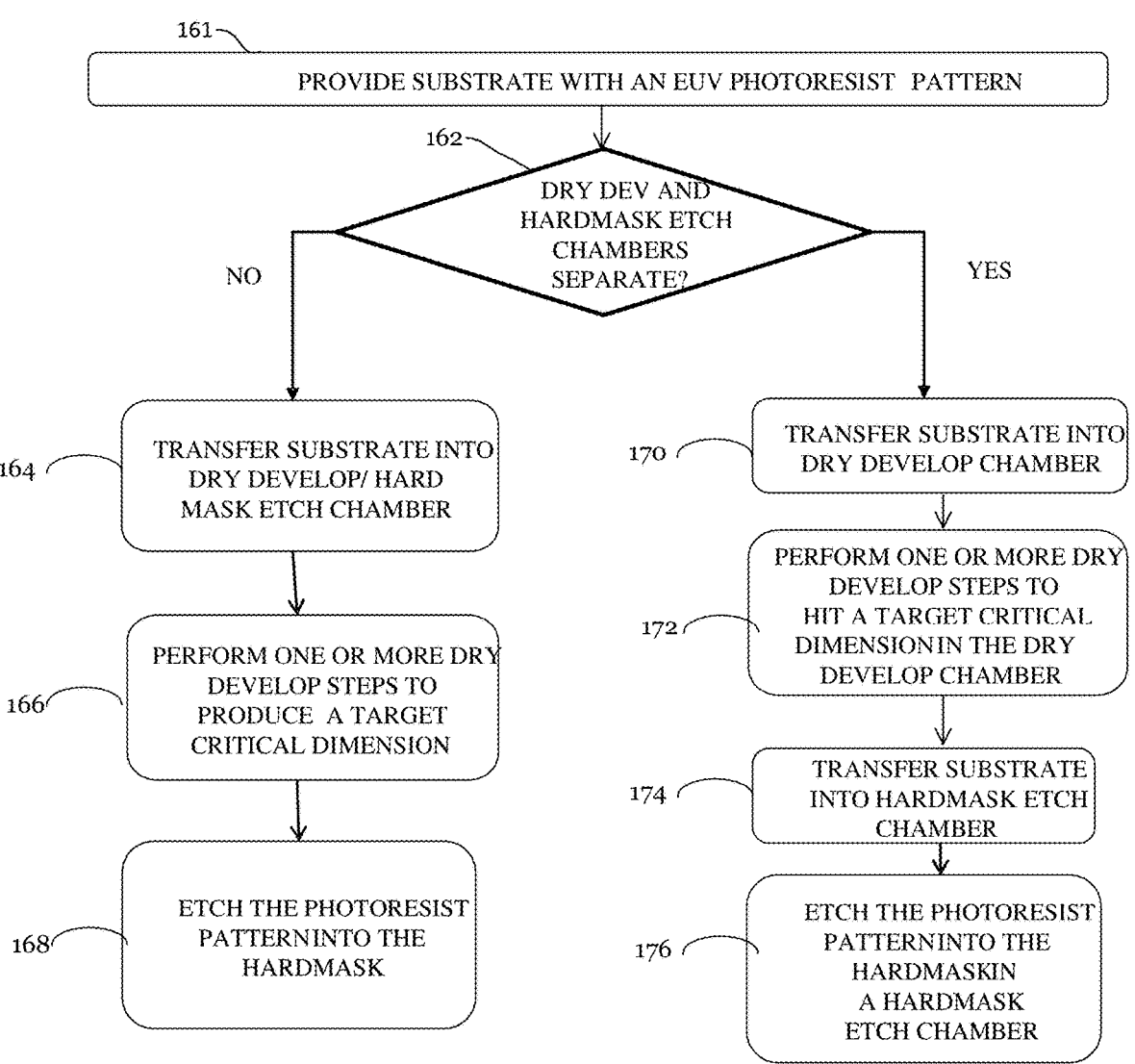
FIG. 11 is a flow diagram describing the formation of an EUV photoresist pattern using hybrid dry/dry develop plus in-situ hard mask etch in accordance with embodiments.

FIG. 11 is a flow diagram of blocks describing the major steps of methods for dry developing and hard mask etching EUV photoresist patterns in-situ. Etching tools 100 and 101 in FIG. 1 and FIG. 3 are used to illustrate the blocks in FIG. 11.

In block 161, a substrate with an EUV photoresist pattern on hard mask material on a substrate is provided. The substrate may be loaded into the load lock chamber as illustrated in FIG. 1, 3, or 8-10 at this stage of processing.

The substrate may include a layer to be etched and in various embodiments may comprise device regions formed therein. The substrate may be a semiconductor wafer such as a silicon or gallium arsenide wafer, may be a chromium layer or other layer on a lithographic reticle, or may be a layer such silicon dioxide, silicon nitride, titanium, titanium nitride, or copper overlying a base substrate structure In general, "substrate" as used herein generically refers to an object being processed. The substrate may include any material portion of structure of a device, particularly a semiconductor or other electronics device, and may, for example, be a base substrate structure, such as a semiconductor wafer, a lithographic reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Embodiments may be implemented in fabrication facilities with different types of etching tools. In block 162 of FIG. 11, the process determines whether the etching tool requires the dry develop and the hard mask etch processes to be performed in the same chamber as in FIG. 1 or different chambers as in FIG. 3. If the etching tool comprises an integrated dry develop and hard mask etch chamber (as in FIG. 1), the substrate is transferred from the load lock chamber to the dry develop and hard mask etch chamber as illustrated in the first run path through the transfer chamber.

Etching tool 100 in FIG. 1 is used to illustrate blocks 164, 166, and 168 in FIG. 11.

In block 164 of FIG. 11, the substrate may be loaded into the dry develop/hard mask etch chamber 108 of etching tool 100.

In block 166 of FIG. 11, one or more dry develop processes may be performed to produce structures with target critical dimensions.

In block 168 of FIG. 11, the hard mask etch process may be performed in the same chamber 108 in which the dry develop process is performed.

If, on the other hand, the hard mask etch processes are to be performed in separate chambers, the substrate is transferred (block 170) from the load lock chamber into the dry develop of etching tool 101 in FIG. 3.

Etching tool 101 in FIG. 3 is used to illustrate blocks 170, 172, 174, and 176 in FIG. 11.

In block 170 of FIG. 11, the substrate may be transferred into the dry develop chamber 112 in etching tool 101. In case of the etching tool 103 (FIG. 8), the substrate may be held in the integrated load lock and dry develop chamber 107/ 109.

In block 172 of FIG. 11, the EUV photoresist pattern may be dry developed in the dry develop chamber 112.

In block 174 of FIG. 11, the substrate may be transferred out of the dry develop chamber 112 and into the hard mask etch chamber 114.

In block 176 of FIG. 11, the EUV photoresist pattern may be transferred into the hard mask material using an aniso- tropic etch in the hard mask etch chamber 114.

FIG. 12 is a flow diagram of blocks describing the major steps of methods for hybrid wet/dry developing EUV pho- toresist patterns. The hybrid wet development plus in-situ dry development/hard mask etch system 160 in FIG. 13 is used to illustrate the blocks in FIG. 12.

Figure 13:
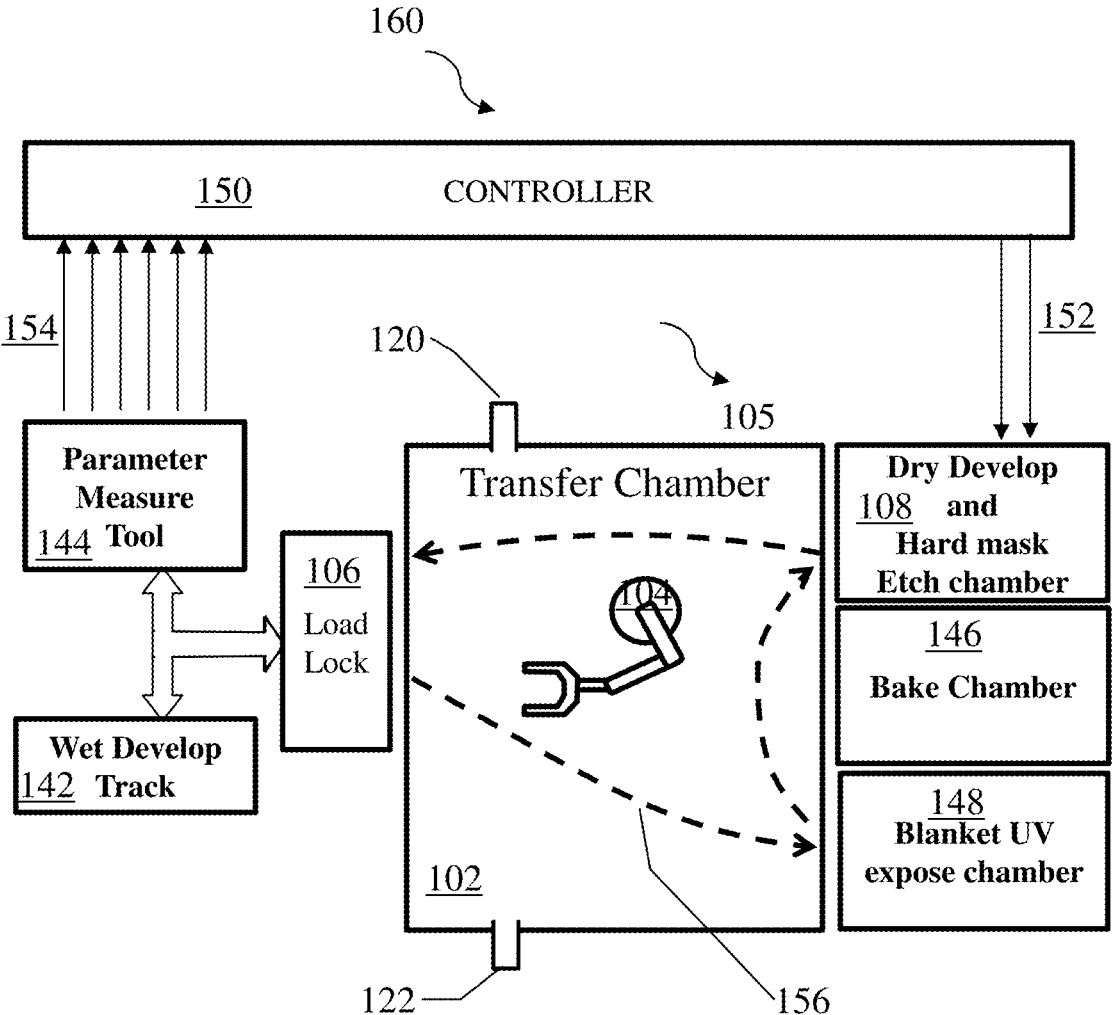
FIG. 13 is a block diagram of a semiconductor apparatus for developing and etching an EUV photoresist pattern in-situ in accordance with embodiments.

The hybrid wet development plus in-situ dry develop- ment/hard mask etch system 160 in FIG. 13 includes a wet develop track 142 coupled to etching tool 105. Etching tool 105 is configured to perform both dry development pro- cesses and a hard mask etch process in-situ. In FIG. 13, etching tool 105 is also configured with optional bake chamber 146 and blanket UV expose chamber 148.

The hybrid wet development plus in-situ dry develop- ment/hard mask etch system 160 may also include a param- eter measurement tool 144. For example, the parameter measurement tool 144 may be a CD measurement tool. The parameter measurement tool 144 may be either in a track or may be stand alone. A controller 150 may be coupled to the parameter measurement tool 144 and also may be coupled to the dry develop/hard mask etch chamber 108 as well as coupled to other processing chambers. The controller 150 can collect 154 parameter measurement data, compare the parameter data to parameter specifications, generate control signals, and send the control signals 152 to microcontrollers in the dry develop/hard mask etch chamber 108 and to other processing chambers to adjust process recipes such as the dry develop recipe and bake recipes so that structures in the EUV photoresist pattern meet parameter specifications and meet across wafer uniformity specifications post processing.

In block 180 in FIG. 12, an EUV photo resist pattern is partially wet developed. After the partial wet develop a width on a structure in the EUV photo resist pattern is larger than the target CD.

In block 182 of FIG. 12, the substrate with the partially wet developed EUV photoresist pattern is transferred from the wet develop track 142 and into the etching tool 105 in FIG. 13.

In block 184 of FIG. 12, the EUV photoresist pattern may optionally receive thermal treatment in the bake chamber 146 in etching tool 105 in FIG. 13. Alternatively, the EUV photoresist pattern may optionally receive blanket UV radia- tion exposure in blanket UV expose chamber 148. Thermal treatment processes and blanket UV exposure processes are typically performed to increase cross linking in exposed EUV photoresist to increase pattern strength, alter the EUV photoresist development rate, and improve line edge rough- ness (LER).

In block 186 of FIG. 12, after wet development of the EUV photoresist pattern on the wet develop track 142, the substrate may be transported through the load lock chamber 106, through the transfer chamber 102 and into the dry develop/hard mask etch chamber 108 of etching tool 105.

In blocks 188 and 190 of FIG. 12, dry develop processes and hard mask etch processes are performed sequentially in the dry develop/hard mask etch chamber 108. The fourth run path 156 indicated by dashed line in FIG. 13 is similar to the second run path 116 in FIG. 2. The fourth run path 156 changes depending upon if a blanket UV expose process is performed in blanket UV expose chamber 148 or if a thermal treatment process is performed in bake chamber 146.

FIG. 14 is a flow diagram of blocks describing the major steps of a method for hybrid wet/dry developing EUV photoresist patterns including the use of sensors to measure a pattern parameter, a controller to generate control signals and to control subsequent processes.

The hybrid wet development and in-situ dry development/ hard mask etch system 160 in FIG. 13 is used to illustrate the blocks in FIG. 14.

In block 200 of FIG. 14, an EUV photoresist pattern may be partially developed on a wet development track 142 such as is in the hybrid wet development and in-situ dry devel- opment/hard mask etch system 160 in FIG. 13.

In block 202 of FIG. 14, a sensor in parameter measure tool 144 in FIG. 13 measures a parameter of a feature of the EUV photoresist pattern. An example sensor may be a CD measurement sensor. The CD measurement sensor may measure a local CD on one specific structure or may measure across wafer CD uniformity on several structures. Another example sensor may be an optical sensor that measures a monomer concentration parameter in exposed and/or unex- posed EUV photoresist locally or across the wafer. Another example sensor may be a thermal sensor that measures a temperature parameter of the EUV photoresist locally or across the wafer. Another example sensor may be a thickness sensor that measures a thickness parameter of the EUV photoresist locally or across the wafer. Parameter measure- ment data from one or more of these sensors can be gathered by the controller 150.

In block 204 of FIG. 14, the controller 150 may be programmed to generate control signals able to control processes during the EUV photoresist pattern development and hard mask etch processes. For example, a dry develop control signal 152 may be generated and sent to the dry develop/hard mask etch chamber 108 to adjust the dry develop recipe so that structures in the EUV photoresist pattern meet a target CD specification post develop. For example, a thermal treatment signal or blanket UV expose control signal may be generated and sent to the bake chamber 146 or the blanket UV expose chamber 148 to adjust the thermal treatment recipe or the blanket UV expose recipe to produce target critical dimensions and to improve across wafer uniformity. For example, hard mask etch control signals may be generated and sent to the dry develop/ hard mask etch chamber 108 to adjust the hard mask etch recipe to produce target critical dimensions and to improve across wafer uniformity.

In block 206 of FIG. 14, after wet develop or after a parameter measurement, the substrate is loaded into the etching tool 105 in FIG. 13.

In block 208 of FIG. 14, an optional thermal treatment or blanket UV exposure may be performed. Thermal treatment or blanket UV expose control signals sent from the control- ler 150 may adjust the thermal treatment or blanket UV exposure recipe wafer-by wafer to produce target critical dimensions and to improve across wafer uniformity on every wafer.

In block 210 of FIG. 14, the substrate is loaded into the dry develop/hard mask etch chamber 108 in etching tool 105 in FIG. 13.

In block 212 of FIG. 14, a dry develop process may be performed in the dry develop/hard mask etch chamber 108. Dry develop control signals sent from the controller 150 may adjust the dry develop recipe wafer-by-wafer to produce target critical dimensions and improve across wafer uniformity on every wafer.

In block 214 of FIG. 14, a hard mask etch process may also be performed in the dry develop/hard mask etch chamber 108. Hard mask etch control signals sent from the controller 150 may adjust to the hard mask etch recipe wafer-by-wafer to produce target critical dimensions and to improve across wafer uniformity on every wafer.

Embodiment etching tools that perform dry development and hard mask etch in-situ, reduce cycle time, and reduce tool cost thus reducing manufacturing cost. In embodiments, the etching tool has a hard mask etching chamber and a dry develop chamber on the same etching tool platform. In other embodiments, the dry develop processes and the hard mask etch process may be performed in the same chamber reducing tool cost. In embodiments, dry development processes may be performed in the load lock chamber.

As discussed above, in one embodiment, the etching tool has separate dry develop and hard mask etch chambers. In another embodiment, the hard mask etching chamber is also configured for dry developing. In one embodiment, the dry develop chamber is a chemical vapor develop chamber. In another embodiment, the dry develop chamber is a plasma develop chamber. In another embodiment, the load lock chamber also doubles as the dry develop chamber. In other embodiments, a bake chamber or a blanket UV expose chamber is included in the etching tool.

In another embodiment, the dry develop process and the hard mask etch process are performed sequentially in the same plasma etch chamber. In one embodiment, the dry develop process is a chemical vapor develop process and the hard mask etch process is a plasma etch process. In another embodiment, the dry develop process is a plasma develop process and the hard mask etch process is a plasma etch process. In other embodiments, the substrate undergoes baking or is treated with a blanket UV exposure prior to the dry development process.

In another embodiment, the EUV photoresist pattern is partially developed using a wet development step before it is transferred into an embodiment etching tool configured to dry develop and hard mask etch. After a first partial development, a width of a target structure in the EUV photoresist pattern is larger than a target critical dimension (CD) specification. After the dry development process and prior to hard mask etching, the width of the target structure may be equal to the critical dimension CD specification.

In another embodiment, a sensor measures a parameter of the EUV photoresist pattern and sends data to a controller that is coupled to the dry development chamber and possibly coupled to other process chambers as well. The controller can be programmed to generate a control signal that makes adjustments to the dry develop recipe and possibly to other process recipes such as a bake recipe to produce target critical dimensions and to improve across wafer uniformity.

Accordingly, various embodiments enable improved development of extreme ultraviolet photoresist films while reducing production costs.

Example embodiments of the present invention are summarized here. Other embodiments can also be understood from the entirety of the specification and the claims filed herein.

Example 1. An etching tool includes an etch chamber for plasma etching a first wafer to be processed; a transfer chamber coupled to the etch chamber; a first run path between the transfer chamber and the etch chamber, the first run path including a path for moving the first wafer to be processed from the transfer chamber to the etch chamber, where the etching tool is configured to dry develop the first wafer to be processed before etching a hard mask on the first wafer in the etch chamber.

Example 2. The etch tool of example 1, further including: a dry develop chamber to develop a photo resist layer on the first wafer to be processed coupled to the transfer chamber; a second run path between the transfer chamber and the dry develop chamber, the second run path including a path for moving the first wafer to be processed from the transfer chamber to the dry develop chamber and from the dry develop chamber to the etch chamber.

Example 3. The etch tool of one of examples 1 or 2, further including: a load lock chamber coupled to the transfer chamber for transferring the first wafer between another apparatus and the transfer chamber.

Example 4. The etch tool of one of examples 1 to 3, where the load lock chamber is configured to dry develop a photo resist layer on the first wafer to be processed.

Example 5. The etch tool of one of examples 1 to 4, where the etch chamber is configured to dry develop a photo resist layer on the first wafer to be processed. 6. The etch tool of one of examples 1 to 4, where the etch chamber is configured to dry develop a photo resist layer and configured to plasma etch a hard mask on the first wafer.

Example 7. The etch tool of one of examples 1 to 6, further including an ultraviolet (UV) chamber for exposing the first wafer with UV light.

Example 8. The etch tool of one of examples 1 to 7, further including a bake chamber for thermally treating the first wafer.

Example 9. The etch tool of one of examples 1 to 8, where the transfer chamber is coupled to a vacuum system.

Example 10. The etch tool of one of examples 1 to 9, further including: a measurement sensor for measuring a parameter of a feature of a photo resist layer on the first wafer prior to the dry develop; and a controller programmed to generate a control signal to control a subsequent process for the dry develop based on the parameter.

Example 11. A method for forming a patterned structure in a hard mask including: depositing a photoresist film on hard mask material on a working surface of a semiconductor substrate; exposing the photoresist film with a pattern of extreme ultraviolet radiation to form an exposed photoresist film; loading the substrate into an apparatus capable of dry developing and capable of hard mask etching; dry developing the exposed photoresist film; and after the dry developing, etching the hard mask material in a hard mask etch chamber to form the patterned structure.

Example 13. The method of one of examples 11 or 12, where the dry developing and the hard mask etching are performed sequentially in the hard mask etch chamber.

Example 14. The method of one of examples 11 to 13, where dry development is chemical vapor etch developing using hydrogen chloride or hydrogen bromide gas.

Example 15. The method of one of examples 11 to 14, where dry developing is plasma etch developing using hydrogen bromide and argon gas.

Example 16. The method of one of examples 11 to 15, further including: blanket exposing the substrate with UV light prior to the dry developing.

Example 17. A method for forming a pattern includes depositing a photoresist film over a hard mask material disposed over a semiconductor substrate; exposing the photoresist film with a pattern of extreme ultraviolet radiation to form an exposed photoresist film; wet developing the exposed photoresist film on a wet development track; loading the substrate into a processing apparatus configured for dry developing and configured for plasma etching; dry developing the exposed photoresist film to form a photoresist pattern; and etching the photoresist pattern into the hard mask material in a hard mask etch chamber to form the patterned structure.

Example 18. The method of example 17, wherein the wet developing comprises using 0% to 10% acetic acid, propylene glycol methyl ether acetate, and methyl isobutyl carbinol, or combinations thereof.

Example 19. The method of one of examples 17 to 18, where dry developing is chemical vapor etch developing including using hydrogen chloride or hydrogen bromide.

Example 20. The method of one of examples 17 to 18, where dry developing is plasma etch developing using hydrogen chloride, hydrogen bromide, argon, helium, or combinations thereof.

Example 21. The method of one of examples 17 to 20, further including: after the wet developing, measuring a critical dimension on the photoresist pattern and collecting critical measurement data; sending the critical dimension data to a controller coupled to the dry developing chamber; and the controller adjusting a dry development recipe to reach a target critical dimension post dry development.

Example 22. The method of one of examples 17 to 21, further including: blanket exposing the photoresist film with UV light prior to dry developing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a patterned structure, the method comprising:
   depositing a photoresist film on a hard mask material disposed over a substrate;
   exposing the photoresist film with a pattern of extreme ultraviolet radiation to form an exposed photoresist film;
   partially wet developing the exposed photoresist film on a wet development track;
   measuring a parameter of a feature of the exposed photoresist film by a parameter measuring tool and sending measurement data to a controller;
   loading the substrate into an apparatus capable of dry developing and capable of hard mask etching;
   dry developing the exposed photoresist film;
   wherein a critical dimension of the feature is equal to a target critical dimension after the dry developing; and
   after the dry developing, etching the hard mask material in a hard mask etch chamber to form the patterned structure.

2. The method of claim 1, wherein the dry developing is performed in a dry develop chamber and the hard mask etching is performed in the hard mask etch chamber.

3. The method of claim 1, wherein the dry developing and the hard mask etching are performed sequentially in the hard mask etch chamber.

4. The method of claim 1, wherein the dry development is chemical vapor etch developing using hydrogen chloride or hydrogen bromide gas.

5. The method of claim 1, wherein the dry developing is plasma etch developing using hydrogen bromide and argon gas.

6. The method of claim 1, further including:
   blanket exposing the substrate with UV light prior to the dry developing.

7. A method for forming a patterned structure, the method comprising:
   depositing a photoresist film over a hard mask material disposed over a semiconductor substrate;
   exposing the photoresist film with a pattern of extreme ultraviolet radiation to form an exposed photoresist film;
   wet developing the exposed photoresist film on a wet development track;
   wherein wet developing the exposed photoresist film on a wet development track comprises partially developing the exposed photoresist film in a hybrid wet development and in-situ dry development/hard mask etch system;
   measuring a parameter of a feature of the exposed photoresist film by a parameter measuring tool and sending measurement data to a controller;
   loading the substrate into a processing apparatus configured for dry developing and configured for plasma etching;
   dry developing the exposed photoresist film to form a photoresist pattern; and
   wherein a critical dimension of the feature is equal to a target critical dimension after the dry developing; and
   etching the photoresist pattern into the hard mask material in a hard mask etch chamber to form the patterned structure.

8. The method of claim 7, wherein the wet developing comprises using 0% to 10% acetic acid, propylene glycol methyl ether acetate, and methyl isobutyl carbinol, or combinations thereof.

9. The method of claim 7, wherein the dry developing is chemical vapor etch developing comprising using hydrogen chloride or hydrogen bromide.

10. The method of claim 7, wherein the dry developing is plasma etch developing using hydrogen chloride, hydrogen bromide, argon, helium, or combinations thereof.

11. The method of claim 7, further comprising generating a dry develop control signal based on the parameter.

12. The method of claim 7, further comprising performing a thermal treatment or blanket UV exposure on the substrate in the processing apparatus.

13. A method for forming a patterned structure, the method comprising:
   partially wet developing a pattern in an EUV (extreme ultraviolet radiation) photoresist on a wet development track so that a critical dimension on a structure in the pattern is larger than a target critical dimension, the EUV photoresist being on a substrate;
   measuring a parameter of a feature of the pattern by a parameter measuring tool and sending measurement data to a controller, the controller being programmed to generate a dry develop control signal based upon the parameter;
   loading the substrate into an etching tool;
   loading the substrate into a dry develop and hard mask etch chamber of the etching tool;
   performing, one or more dry development steps using the dry develop control signal to adjust a dry develop recipe;

wherein the critical dimension on the structure is equal to the target critical dimension after the one or more dry development steps; and etching the pattern after the one or more dry development steps in the dry develop and hard mask etch chamber to form the patterned structure.

14. The method of claim 13, further comprising performing a thermal treatment on the substrate in the etching tool before loading the substrate into the dry develop and hard mask etch chamber.

15. The method of claim 13, further comprising performing a blanket UV exposure on the substrate in the etching tool before loading the substrate into the dry develop and hard mask etch chamber.

\* \* \* \* \*